United States Patent [19]

Lopata

[11] Patent Number: 5,377,896
[45] Date of Patent: Jan. 3, 1995

[54] AUTOMATIC MASS HANDLING SYSTEM FOR SMALL ELECTRONIC COMPONENTS

[75] Inventor: Thomas P. Lopata, Earl Township, Berks County, Pa.

[73] Assignee: AT&T Corp., Murray Hill, N.J.

[21] Appl. No.: 151,443

[22] Filed: Nov. 12, 1993

[51] Int. Cl.⁶ .......................................... H01L 21/68
[52] U.S. Cl. ............................... 228/49.5; 29/743; 269/21
[58] Field of Search ............... 228/49.5, 4.5; 29/743; 269/21

[56] References Cited

U.S. PATENT DOCUMENTS

| | | | |
|---|---|---|---|
| 3,299,502 | 1/1967 | Wanesky | 29/743 |
| 3,379,357 | 4/1968 | Chagnon et al. | 228/49.5 |
| 3,704,504 | 12/1972 | Koegler | 29/743 X |
| 3,949,295 | 4/1976 | Moorshead | 269/21 X |

*Primary Examiner*—Kenneth J. Ramsey

[57] ABSTRACT

An automatic mass handling system for the bonding of electronic components in small electronic devices, includes a plurality of modules for holding a plurality of the electronic devices in a predetermined orientation, each module including a cup-shaped main body having a circumferential wall and a bottom wall which closes a bottom of the circumferential wall, a top component holding wall secured to an upper surface of the circumferential wall and having a plurality of component holding holes therein for retaining the plurality of electronic devices therein, an aligning member for aligning the electronic devices in the component holding holes in a predetermined orientation, and a vacuum hold down hole formed in the bottom wall, for holding the electronic devices in the predetermined orientation in the plurality of component holding holes when a vacuum is applied through the vacuum hold down hole; and a boat for holding a plurality of the modules in a predetermined orientation for transportation.

27 Claims, 3 Drawing Sheets

AUTOMATIC MASS HANDLING SYSTEM FOR SMALL ELECTRONIC COMPONENTS

BACKGROUND OF THE INVENTION

The present invention relates generally to the bonding of small electronic components, and more particularly, is directed to a mass handling system for the bonding of small electronic components.

In the bonding of electronic packages or boards containing many components, it is known to mount a plurality of identical electronic packages on a boat. The boat is then transported by an indexing mechanism to a bonding apparatus which automatically bonds electrical connections between various components of the electronic packages.

However, in many instances, it is desirable to bond electrical connections between various elements of a very small component, such as a TO header type lightwave device. A TO header type lightwave device includes a very small metal package or TO style header that holds a light emitting diode (LED), a PIN photodiode, a photoreceiver or the like. Specifically, the TO style header may include a circular head on which the electronic components, such as an integrated circuit (IC), a PIN photodiode and a capacitor are mounted, and three legs extending axially down from the underside of the circular head. In such case, two of the legs are input and output legs, respectively, and extend through to the upper surface of the circular head for connection to the electronic components, and the third leg is a ground leg connected to the underside of the circular head.

With such a TO header type lightwave device, it is necessary to bond electrical connections between the input leg, the output leg, the integrated circuit (IC), the PIN photodiode and the capacitor. However, because of the small size of the TO header type lightwave device, it has not been possible to perform this bonding operation in a mass production operation. Accordingly, this has been performed manually at a slow rate, and with a greater amount of errors that would normally occur with a mass production system.

SUMMARY OF THE INVENTION

Accordingly, it is an object of the present invention to provide an automatic mass handling system for small electronic components that overcomes the problems with the aforementioned prior art.

It is another object of the present invention to provide an automatic mass handling system for bonding of small electronic components.

It is still another object of the present invention to provide an automatic mass handling system for manufacturing small electronic components with increased throughput, quality and flexibility.

Thus, with the present invention, TO header type lightwave devices can be manufactured in an automatic system with increased throughput, quality and flexibility.

It is yet another object of the present invention to provide an automatic mass handling system for TO header type lightwave devices.

In accordance with an aspect of the present invention, an automatic mass handling system for the bonding of electronic components in small electronic devices, includes a plurality of modules for holding a plurality of the electronic devices in a predetermined orientation, each module including an upper surface having a plurality of component holding holes therein for retaining the plurality of the electronic devices in the predetermined orientation, and a vacuum hold down hole, positioned below the upper surface, for holding the electronic devices in the predetermined orientation in the plurality of component holding holes when a vacuum is applied through the vacuum hold down hole; and a boat for holding a plurality of the modules in a predetermined orientation for transportation.

Specifically, each module includes a cup-shaped main body having a circumferential wall and a bottom wall which closes a bottom of the circumferential wall; and a top component holding wall secured to an upper surface of the circumferential wall and having the upper surface with the plurality of component holding holes therein for retaining the plurality of electronic devices in the predetermined orientation.

The boat includes a transport surface, and a plurality of module containing holes in the transport surface for holding the plurality of modules in the predetermined orientation; and the main body is cut-away along a lower end of an outer circumference thereof to form a circumferential step defined by an upper portion having a first dimension and a lower portion having a second lesser dimension, such that the upper portion rests on the transport surface and the lower portion fits within a respective module containing hole. Preferably, the upper and lower portions each have a generally cylindrical configuration, with the upper portion having an outer diameter greater than the outer diameter of the lower portion.

The lower portion of each module is formed with a first irregular portion and each module containing hole is formed with a corresponding second irregular portion to align each module in any module containing hole. Preferably, the first irregular portion includes a flat portion formed on the lower portion of the main body and the second irregular portion includes a flat edge partially defining each module containing hole.

Further, the circumferential wall of the main body is cut-away at an upper end of an inner circumference thereof to form an inner circumferential shoulder, and the top component holding wall seats on the inner circumferential shoulder, and each module further includes rivets for fixedly securing the top component holding wall on the inner circumferential shoulder.

In addition, each top component holding wall has an irregular detent extending into each component holding hole, and each electronic device has a head portion having a cut-out corresponding in shape to the irregular detent.

The vacuum hold down hole is formed in the bottom wall of the main body through which a vacuum can be applied for holding down the electronic devices in the component holding holes.

Each electronic device includes a head portion which is cut-away along an outer circumference at a lower end thereof to form a circumferential step defined by an upper portion having a first dimension and a lower portion having a second lesser dimension, such that the upper portion rests on the upper surface of a respective module and the lower portion fits within a respective component containing hole. The upper portion of the head portion includes a central recess for holding electronic components thereon. Preferably, the electronic devices are TO header type lightwave devices.

In accordance with another aspect of the present invention, an automatic mass handling system for the bonding of electronic components in small electronic devices, includes a plurality of modules for holding a plurality of the electronic devices in a predetermined orientation, each module including a cup-shaped main body having a circumferential wall and a bottom wall which closes a bottom of the circumferential wall, a top component holding wall secured to an upper surface of the circumferential wall and having a plurality of component holding holes therein for retaining the plurality of electronic devices therein, an aligning member for aligning the electronic devices in the component holding holes in a predetermined orientation, and a vacuum hold down hole formed in the bottom wall, for holding the electronic devices in the predetermined orientation in the plurality of component holding holes when a vacuum is applied through the vacuum hold down hole; and a boat for holding a plurality of modules in a predetermined orientation for transportation.

In accordance with still another aspect of the present invention, a module for holding a plurality of small electronic devices in a predetermined orientation in a boat, includes a cup-shaped main body having a circumferential wall and a bottom wall which closes a bottom of the circumferential wall, a top component holding wall secured to an upper surface of the circumferential wall and having a plurality of component holding holes therein for retaining the plurality of electronic devices therein, an aligning member for aligning the electronic devices in the component holding holes in a predetermined orientation, and a vacuum hold down hole formed in the bottom wall, for holding the electronic devices in the predetermined orientation in the plurality of component holding holes when a vacuum is applied through the vacuum hold down hole.

The above and other objects, features and advantages of the invention will become readily apparent from the following detailed description thereof which is to be read in connection with the accompanying drawings.

DESCRIPTION OF THE PREFERRED EMBODIMENTS

Figure 1:
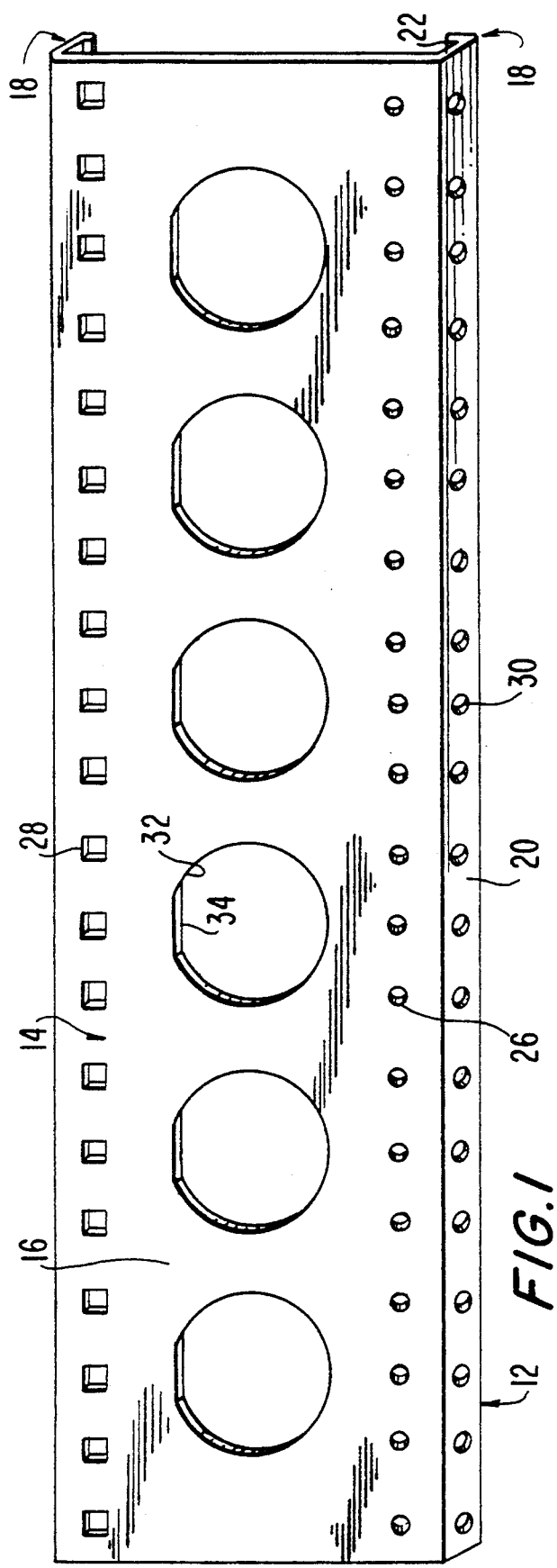
FIG. 1 is a perspective view of a boat according to the present invention.
Figure 2:
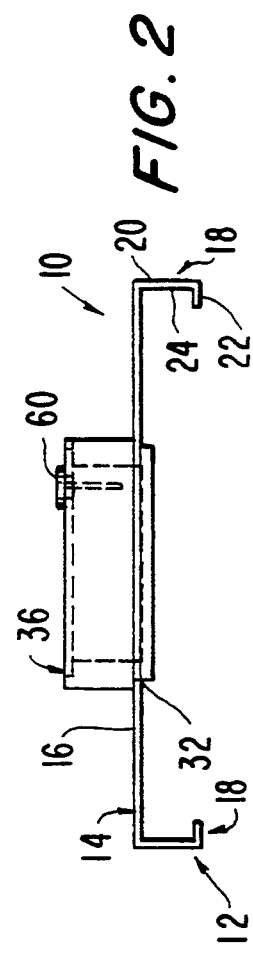
FIG. 2 is an end elevational view of the boat of FIG. 1, with a header handling module and TO style header therein.
Figure 3:
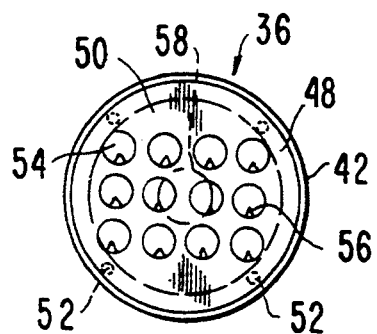
FIG. 3 is a top plan view of the header handling module of FIG. 2.
Figure 4:
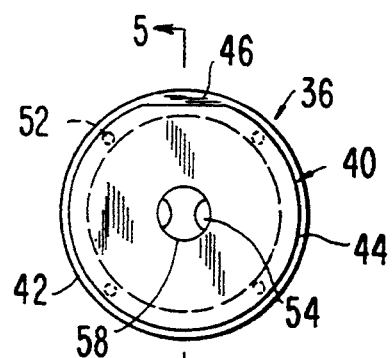
FIG. 4 is a bottom plan view of the header handling module of FIG. 2.
Figure 5:
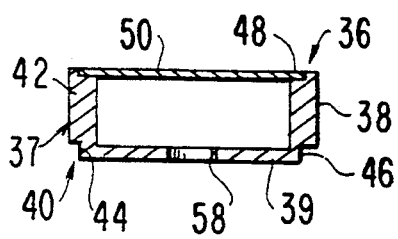
FIG. 5 is a cross-sectional view of the header handling module of FIG. 4, taken along line 5—5 thereof.

Referring to the drawings in detail, and initially to FIGS. 1 and 2 thereof, a stainless steel boat 12 of a mass handling system 10 according to the present invention is shown. Such a stainless steel boat 12 is conventional for conveying electronic packages or boards containing many components, for bonding. Thus, for example, a 3.1" wide boat can be used to allow use of standard industry boat indexing systems.

Specifically, boat 12 includes an elongated flat sheet 14 of stainless steel defining an upper surface 16. L-shaped guides 18 are formed at opposite longitudinal edges of upper surface 16 by bending. Preferably, each L-shaped guides 18 has a long leg 20 extending downwardly from a respective longitudinal edge of upper surface 16 at an angle of 90°, and a short leg 22 extending inwardly at an angle of 90° from the free longitudinal edge of each long leg 20, so as to be positioned below and parallel to upper surface 16. As a result, guideways 24 are formed between upper surface 16, long legs 20 and short legs 22, in order to guide boat 12 along a guide track (not shown).

In order to index boat 12 along the guide track, a plurality of circular holes 26 are periodically positioned along one longitudinal edge of upper surface 16, and a plurality of square holes 28 are periodically positioned along the opposite longitudinal edge of upper surface 16. Holes 26 and 28 mate with indexing fingers (not shown) or the like to move boat 12 along the guide track in a predetermined manner.

In addition, circular holes 30 are periodically positioned along the long leg 20 of each L-shaped guide 18, for engaging with indexing fingers (not shown) or the like to help move boat 12 along the guide track in the predetermined manner. It will be appreciated that the size, dimensions and shape of holes 26, 28 and 30 may be varied, depending upon the indexing fingers or other indexing means that is used.

As shown best in FIG. 1, a plurality of, for example six, equally spaced module containing holes 32 are formed along the center of upper surface 16, between holes 26 and 28. As shown, each module containing hole 32 has a generally circular configuration, but is provided with a flat portion 34, the purpose for which will be made apparent from the discussion hereinafter.

Mass handling system 10 further includes a plurality of plural position component handling modules 36 which accurately seat within respective module containing holes 32 of boat 12.

Specifically, each module 36 includes a cup-shaped main body 37 formed of a generally annular wall 38 and a bottom 39 which closes the lower end of annular wall 38 and is formed integrally therewith. Preferably, main body 37 is made of aluminum.

Main body 37 is cut-away along the lower end of the outer circumference thereof to define an annular step 40 which is sized to seat accurately and easily within a module containing hole 32. Specifically, main body 37 is defined by a large diameter portion 42 and a small diameter portion 44, with small diameter portion 44 seating within a module containing hole 32 and the undersurface of large diameter portion 42 resting on upper surface 16.

In order to accurately align each module 36 in a respective module containing hole 32, a flat portion 46 is formed on each step 40 which corresponds to flat portion 34 when the module 36 is seated in a respective module containing hole 32. Specifically, flat portion 46 is formed on the outer periphery of small diameter portion 44.

Main body 37 is further cut-away at the upper end of the inner circumference thereof to form an inner annular shoulder 48. Each module 36 further includes a component holding disc 50 which seats on inner annular shoulder 48. Disc 50 has an outer diameter substantially identical to or slightly smaller than that of inner annular shoulder 48 so as to prevent play therein when seated on inner annular shoulder 48. In addition, disc 50 has a height which is the same as that of inner annular shoulder 48, so that when disc 50 is seated on inner annular shoulder 48, module 36 has a relatively flat continuous upper surface. After disc 50 is seated on inner annular shoulder 48, it is secured thereon by four equiangularly positioned rivets 52. Preferably, disc 50 is made of stainless steel.

Disc 50 is provided with a plurality of, for example twelve, substantially evenly spaced component holding holes 54. For example, in a preferred embodiment, component holding holes 54 are arranged in three rows of four holes 54 each. Preferably, a triangular aligning detent 56 extends from the main surface of disc 50 into each component holding hole 54, with detents 56 being in angular alignment with each other.

Lastly, bottom 39 of main body 37 is provided with a central vacuum hole 58 therein. Specifically, when a plurality of TO header type lightwave devices are positioned within component holding holes 54, and boat 12 is brought to a bonding position, a conventional vacuum piston (not shown) extends upwardly and engages bottom 39 of a respective module 36. A vacuum is applied by the vacuum piston in order to hold the module 36 thereto. At the same time, the vacuum is applied to the inside of the module 36 through the vacuum hole 58. As a result, the TO header type lightwave devices or other device in component holding holes 54 are pulled down and cannot escape during the bonding operation. It will be appreciated that, with such arrangement, vacuum losses through any spaces between the TO header type lightwave devices and component holding holes 54 are generally limited to 1 in-hg.

Figure 6:
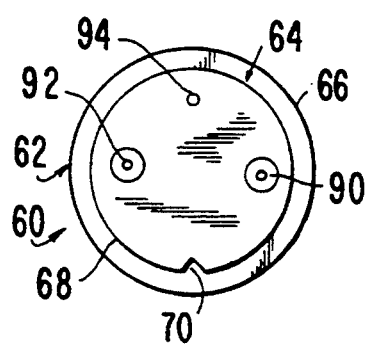
FIG. 6 is a bottom plan view of the TO style header of FIG. 2.
Figure 7:
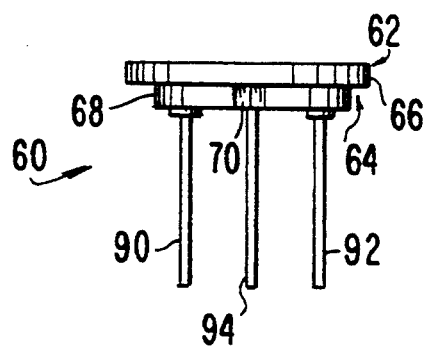
FIG. 7 is an elevational view of the TO style header of FIG. 2.
Figure 8:
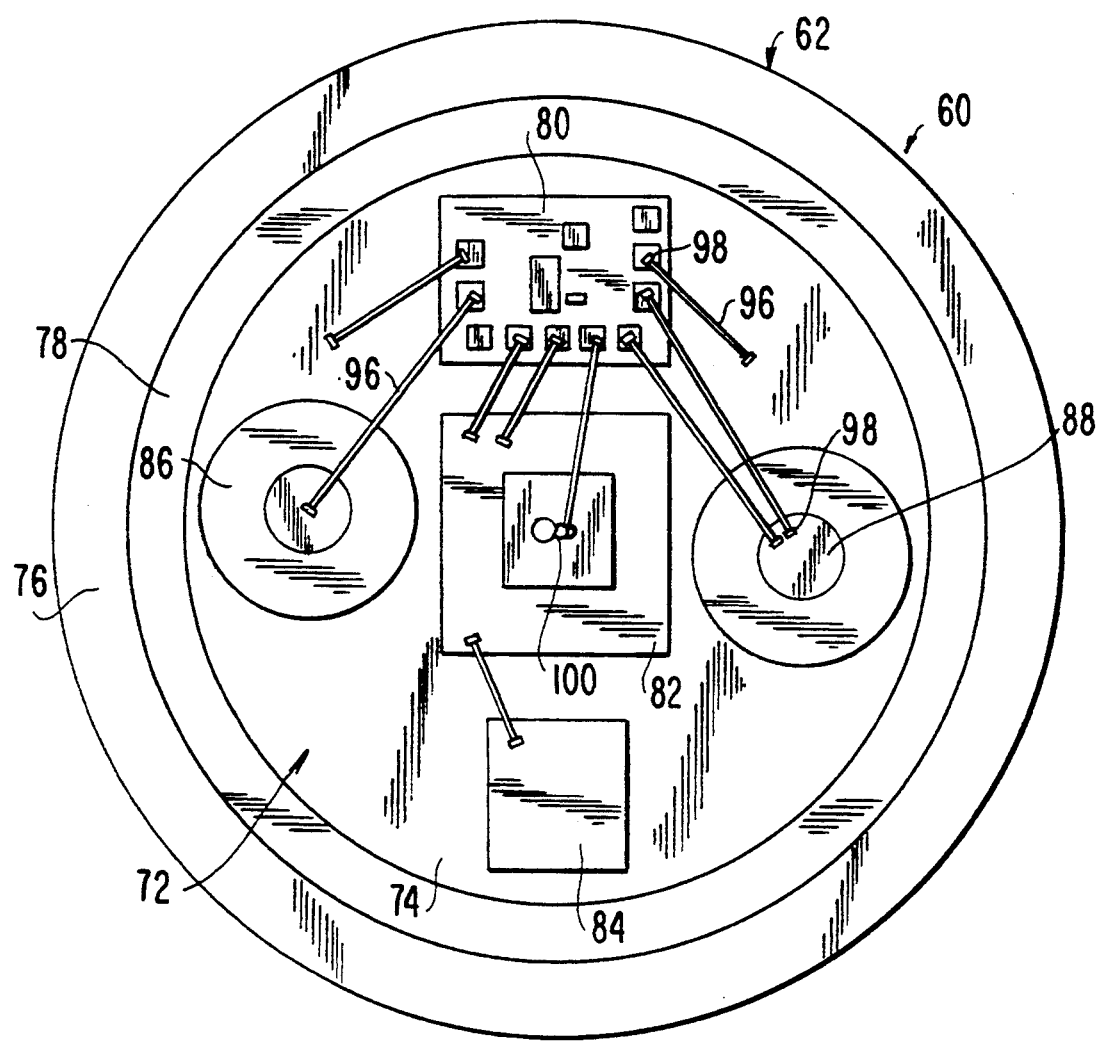
FIG. 8 is an enlarged top plan view of the TO style header of FIG. 2.

The present invention is particularly adapted to the bonding of TO header type lightwave devices 60, an example of which is shown in FIGS. 6–8. As shown therein, TO header type lightwave device 60 includes a generally cylindrical head 62 which is cut-away along the lower end of the outer circumference thereof to define an annular step 64 which is sized to seat accurately and easily within a component holding hole 54. Specifically, cylindrical head 62 is defined by a large diameter portion 66 and a small diameter portion 68, with small diameter portion 68 seating within a component holding hole 54 and the undersurface of large diameter portion 66 resting on the upper surface of component holding disc 50.

In order to accurately align each TO style header 60 in a respective component holding hole 54, a triangular cut-out 70 is formed radially inwardly of each small diameter portion 68, corresponding to triangular aligning detent 56 when the TO style header 60 is seated in a respective component holding hole 54.

In addition, the upper surface of large diameter portion 66 has a central recess 72 therein defined by a bottom 74 and an annular surrounding wall 76 having an inwardly sloped inner surface 78. A plurality of electronic components are positioned on bottom 74. As an example, and as shown in FIG. 8, for a PIN photoreceiver or a light emitting diode (LED), there may be an integrated circuit chip 80, a PIN diode 82, a capacitor 84, an input lead 86 surrounded by a glass insulator 87 and an output lead 88 surrounded by a glass insulator 89. An input wire 90 extends through head 62 into electrical contact with input lead 86, an output wire 92 extends through head 62 into electrical contact with output lead 88, and a ground wire 94 is electrically connected with the underside of small diameter portion 68.

It is necessary, however, to bond electrical wire connectors 96 between the various components on bottom 74. This is relatively easy with the present invention.

Specifically, with the present invention, six modules 36 are aligned in the six module containing holes 32 of boat 12. Further, twelve TO header type lightwave devices 60 are aligned in each module 36. Then, boat 12 is indexed to a predetermined position, and the first module 36 is removed by a conventional vacuum piston (not shown) which extends upwardly and engages bottom 39 of the respective module 36. A vacuum is applied by the vacuum piston in order to hold the module 36 thereto. At the same time, the vacuum is applied to the inside of the module 36 through the vacuum hole 58 thereof. As a result, the TO header type lightwave devices 60 in component holding holes 54 are pulled down and cannot escape during the bonding operation. It will be appreciated that vacuum losses through any spaces between the TO header type lightwave devices 60 and the component holding holes 54 are generally limited to 1 in-hg.

Then, as is conventional, the vacuum piston is rotated to various positions at which bonding of electrical wire connectors 96 to the electronic components takes place. Such bonding can be any conventional bonding such as automatic wedge-wedge bonding 98 and ball-wedge bonding 100.

Thus, with the present invention, TO header type lightwave devices can be manufactured in an automatic system with increased throughput, quality and flexibility.

Having described a specific preferred embodiment of the invention with reference to the accompanying drawings, it will be appreciated that the present invention is not limited to that precise embodiment and that various changes and modifications can be effected therein by one of ordinary skill in the art without departing from the scope or spirit of the invention as defined by the appended claims.

What is claimed is:

1. An automatic mass handling system for the bonding of electronic components in small electronic devices, said system comprising:
   a plurality of module means for holding a plurality of said electronic devices in a predetermined orientation, each said module means including:
      an upper surface having a plurality of component holding holes therein for retaining said plurality of said electronic devices in said predetermined orientation, and
      vacuum hold down means, positioned below said upper surface, for holding said electronic devices in said predetermined orientation in said plurality of component holding holes when a vacuum is applied through said vacuum hold down means; and
   boat means for holding a plurality of said module means in a predetermined orientation for transportation.

2. An automatic mass handling system according to claim 1, wherein each said module means includes:
   a cup-shaped main body having a circumferential wall and a bottom wall which closes a bottom of said circumferential wall; and a top component holding wall secured to an upper surface of said circumferential wall and having said upper surface with said plurality of component holding holes therein for retaining said plurality of electronic devices in said predetermined orientation.

3. An automatic mass handling system according to claim 2, wherein:
said boat means includes:
a transport surface, and
a plurality of module containing holes in said transport surface for holding said plurality of module means in said predetermined orientation; and
said main body is cut-away along a lower end of an outer circumference thereof to form a circumferential step defined by an upper portion having a first dimension and a lower portion having a second lesser dimension, such that said upper portion rests on said transport surface and said lower portion fits within a respective said module containing hole.

4. An automatic mass handling system according to claim 3, wherein said upper and lower portions each have a generally cylindrical configuration, with said upper portion having an outer diameter greater than the outer diameter of said lower portion.

5. An automatic mass handling system according to claim 3, wherein the lower portion of each said module is formed with a first irregular portion and each said module containing hole is formed with a corresponding second irregular portion to align each said module in any said module containing hole.

6. An automatic mass handling system according to claim 5, wherein said first irregular portion includes a flat portion formed on said lower portion of said main body and said second irregular portion includes a flat edge partially defining each said module containing hole.

7. An automatic mass handling system according to claim 2, wherein said circumferential wall of said main body is cut-away at an upper end of an inner circumference thereof to form an inner circumferential shoulder, and said top component holding wall seats on said inner circumferential shoulder, and each said module further includes rivet means for fixedly securing said top component holding wall on said inner circumferential shoulder.

8. An automatic mass handling system according to claim 2, wherein each said top component holding wall has an irregular detent extending into each said component holding hole, and each said electronic device has a head portion having a cut-out corresponding in shape to said irregular detent.

9. An automatic mass handling system according to claim 2, wherein said vacuum hold down means includes a vacuum hole in said bottom wall of said main body through which a vacuum can be applied for holding down said electronic devices in said component holding holes.

10. An automatic mass handling system according to claim 1, wherein each said electronic device includes a head portion which is cut-away along an outer circumference at a lower end thereof to form a circumferential step defined by an upper portion having a first dimension and a lower portion having a second lesser dimension, such that said upper portion rests on said upper surface of a respective said module means and said lower portion fits within a respective said component containing hole.

11. An automatic mass handling system according to claim 10, wherein said upper portion of said head portion includes a central recess for holding electronic components thereon.

12. An automatic mass handling system according to claim 1, wherein said electronic devices are TO header type lightwave devices.

13. An automatic mass handling system according to claim 1, wherein said boat includes a plurality of periodically extending indexing holes for moving said boat in a predetermined manner.

14. An automatic mass handling system for the bonding of electronic components in small electronic devices, said system comprising:
a plurality of module means for holding a plurality of said electronic devices in a predetermined orientation, each said module means including:
a cup-shaped main body having a circumferential wall and a bottom wall which closes a bottom of said circumferential wall,
a top component holding wall secured to an upper surface of said circumferential wall and having a plurality of component holding holes therein for retaining said plurality of electronic devices therein,
aligning means for aligning said electronic devices in said component holding holes in a predetermined orientation, and
a vacuum hold down hole formed in said bottom wall, for holding said electronic devices in said predetermined orientation in said plurality of component holding holes when a vacuum is applied through said vacuum hold down means; and
boat means for holding a plurality of said module means in a predetermined orientation for transportation.

15. An automatic mass handling system according to claim 14, wherein:
said boat means includes:
a transport surface, and
a plurality of module containing holes in said transport surface for holding said plurality of module means in said predetermined orientation; and
said main body is cut-away along a lower end of an outer circumference thereof to form a circumferential step defined by an upper portion having a first dimension and a lower portion having a second lesser dimension, such that said upper portion rests on said transport surface and said lower portion fits within a respective said module containing hole.

16. An automatic mass handling system according to claim 15, wherein said upper and lower portions each have a generally cylindrical configuration, with said upper portion having an outer diameter greater than the outer diameter of said lower portion.

17. An automatic mass handling system according to claim 15, wherein the lower portion of each said module is formed with a first irregular portion and each said module containing hole is formed with a corresponding second irregular portion to align each said module in any said module containing hole.

18. An automatic mass handling system according to claim 17, wherein said first irregular portion includes a flat portion formed on said lower portion of said main body and said second irregular portion includes a flat edge partially defining each said module containing hole.

19. An automatic mass handling system according to claim 14, wherein said circumferential wall of said main body is cut-away at an upper end of an inner circumference thereof to form an inner circumferential shoulder, and said top component holding wall seats on said inner circumferential shoulder, and each said module further includes rivet means for fixedly securing said top component holding wall on said inner circumferential shoulder.

20. An automatic mass handling system according to claim 14, wherein each said top component holding wall has an irregular detent extending into each said component holding hole, and each said electronic device has a head portion having a cut-out corresponding in shape to said irregular detent.

21. A module for holding a plurality of small electronic devices in a predetermined orientation in a boat, said module comprising:
- a cup-shaped main body having a circumferential wall and a bottom wall which closes a bottom of said circumferential wall,
- a top component holding wall secured to an upper surface of said circumferential wall and having a plurality of component holding holes therein for retaining said plurality of electronic devices therein,
- aligning means for aligning said electronic devices in said component holding holes in a predetermined orientation, and
- a vacuum hold down hole formed in said bottom wall, for holding said electronic devices in said predetermined orientation in said plurality of component holding holes when a vacuum is applied through said vacuum hold down means.

22. A module according to claim 21, wherein the boat means includes a transport surface, and a plurality of module containing holes in said transport surface for holding said plurality of module means in said predetermined orientation; and wherein said main body is cut-away along a lower end of an outer circumference thereof to form a circumferential step defined by an upper portion having a first dimension and a lower portion having a second lesser dimension, such that said upper portion rests on said transport surface and said lower portion fits within a respective said module containing hole.

23. A module according to claim 22, wherein said upper and lower portions each have a generally cylindrical configuration, with said upper portion having an outer diameter greater than the outer diameter of said lower portion.

24. A module according to claim 23, wherein the lower portion of each said module is formed with a first irregular portion and each said module containing hole is formed with a corresponding second irregular portion to align each said module in any said module containing hole.

25. A module according to claim 24, wherein said first irregular portion includes a flat portion formed on said lower portion of said main body and said second irregular portion includes a flat edge partially defining each said module containing hole.

26. A module according to claim 21, wherein said circumferential wall of said main body is cut-away at an upper end of an inner circumference thereof to form an inner circumferential shoulder, and said top component holding wall seats on said inner circumferential shoulder, and each said module further includes rivet means for fixedly securing said top component holding wall on said inner circumferential shoulder.

27. A module according to claim 21, wherein each said top component holding wall has an irregular detent extending into each said component holding hole, and each said electronic device has a head portion having a cut-out corresponding in shape to said irregular detent.

* * * * *